United States Patent
Wheaton

(10) Patent No.: US 6,169,659 B1
(45) Date of Patent: Jan. 2, 2001

(54) METERED FORCE SINGLE POINT HEATSINK ATTACH MECHANISM

(75) Inventor: Chris Wheaton, San Francisco, CA (US)

(73) Assignee: Silicon Graphics, Inc., Mountain View, CA (US)

(*) Notice: Under 35 U.S.C. 154(b), the term of this patent shall be extended for 0 days.

(21) Appl. No.: 09/498,939

(22) Filed: Feb. 4, 2000

(51) Int. Cl.⁷ ...................................................... H05K 7/20
(52) U.S. Cl. .......................... 361/704; 361/702; 361/707; 361/709; 361/710; 257/719; 257/726; 165/80.3; 165/185; 174/52.1
(58) Field of Search ................................... 361/700–710, 361/717–722, 767–779, 820; 257/706–727; 165/80.2, 80.3, 804, 185; 439/66, 71, 73, 331, 405, 467, 526; 24/67.9, 295, 458, 563; 206/328, 329, 334; 324/73.1, 755, 758, 760

(56) References Cited

U.S. PATENT DOCUMENTS

| | | | |
|---|---|---|---|
| 5,010,949 | * 4/1991 | Dehaine | 165/76 |
| 5,240,549 | * 8/1993 | Hamburgen et al. | 156/583.91 |
| 5,648,890 | * 7/1997 | Loo et al. | 361/704 |
| 5,842,512 | * 12/1998 | Guerrero | 165/80.3 |
| 6,058,014 | * 5/2000 | Choudhury et al. | 361/704 |

FOREIGN PATENT DOCUMENTS

2163598A * 8/1984 (GB) .............................. H01L 23/36

* cited by examiner

Primary Examiner—Gerald Tolin
Assistant Examiner—Michael Datskovsky
(74) Attorney, Agent, or Firm—Wagner, Murabito & Hao LLP

(57) ABSTRACT

The present invention is drawn to a system and a method for attaching and tightening a mechanism onto an IC package such that a load-balanced thermal contact is formed securely between the mechanism and the IC package without risking damages to the IC package. The mechanism is then used to support a heat sink that utilizes the thermal contact formed for dissipating heat away from the IC package. Specifically, the mechanism is modified in stages. During the tightening stage, the mechanism is modified from a first configuration into a second configuration in order to trigger the process of tightening the mechanism securely onto the IC package. More specifically, in its first configuration during the attaching stage, the mechanism includes a spring compressed within a first spacing formed by a bearing plate and a compression screw. Then, the mechanism is modified into the second configuration by the removal of the compression screw, wherein the same spring is compressed at a second spacing formed by the bearing plate and a terminating plate, and wherein the second spacing is longer than the first space as to allow the spring to lengthen to a desired length. As the spring lengthens to its desired length, it pulls the heat sink support towards the IC package and pushes the IC package towards the heat sink support. In so doing, a load-balanced and efficient thermal contact is formed securely between the mechanism and the IC package without risking damages to the IC package.

27 Claims, 22 Drawing Sheets

300

500

550, IC PACKAGE SIDE

570, NON-IC PACKAGE SIDE

600

800

METERED FORCE SINGLE POINT HEATSINK ATTACH MECHANISM

FIELD OF INVENTION

The present invention pertains to heat sink for an integrated circuit (IC) package. More specifically, the present invention is related to a system and methodology for coupling a heat sink onto an IC package.

BACKGROUND OF THE INVENTION

As electronic circuits get increasingly more powerful and ever smaller in size, the problem of removing heat from the chips is more critical. In particular, a typical operating IC package heats up to a very high temperature that can actually melt and damage the inner parts of the IC package. Thus, heat sink becomes necessary for preventing dangerous heat build-up within the IC package.

The heat sink dissipates heat away from the IC package before heat is accumulated up to a dangerous scenario wherein the IC package is damaged by high temperature. Specifically, the heat is removed by an external metal heat sink which must be closely coupled to the top surface of the IC package. The more closely the heat sink can be coupled to the IC package, the more efficient the transfer of heat away from the IC package. At the same time, the fragility of the IC package need to be taken into consideration such that the coupling does not exert too much force to damage the IC package.

In view of the heating problem associated with an IC package, various methods and mechanical systems were introduced to couple a heat sink onto the IC package. Prior art approaches includes gluing a heat sink onto the IC package, screwing a heat sink onto the IC package, and applying spring force to press a heat sink onto the IC package. Each approach can be evaluated in terms of ease of installation, ease of removal, reliability and efficiency of heat transfer.

The prior art approach of gluing a heat sink onto the IC package enables a straightforward installation. However, once the heat sink is installed by gluing, the heat sink can hardly be removed without damaging the IC package. Also, for large heat sinks, the weight of the heat sink is supported solely by the case of the IC package and the solder connections. Possibility of damages to the IC package is greatly increased. Moreover, installation by gluing introduces at least one extra layer between the heat sink and the top surface of the IC package. Efficiency of heat transfer is thus reduced.

The prior art approach of screwing a heat sink onto the IC package allows for a straightforward installation. Moreover, the removal of the heat sink can be accomplished simply by unscrewing. However, the tolerances involved in both the assembly of the IC package to the board and the manufacture of the heat sink introduce further problems. Specifically, the tolerances involved require several layers of compressible thermal gasket to be used in order to account for the tolerance. Each layer of gasket reduces the amount of heat that can be removed from the IC package. Thus, this approach is not efficient in transferring heat away from the IC package.

The prior art approach of applying spring force to keep a heat sink in place overcomes many of the problems discussed above. To account for the tolerances mentioned above, multiple springs are implemented to simultaneously apply force to the heat sink such that the heat sink is secured in contact with the top surface of the IC package. However, the compression of these springs must satisfy stringent requirements. That is, the spring must be compressed with sufficient force to seat a thermal gasket while not so much force to cause damage to the IC package. Typically, what is allowed in practice is a very narrow range of force for compressing the springs.

Furthermore, the spring force is usually applied at the corners of he IC package with four separate compression springs. As such, heat sink installation becomes a delicate process because these springs must be compressed in a balanced fashion so as to avoid asymmetrical loading on the case of the IC package. Specifically, damages on the IC package can result from asymmetrical loading on the case of the IC package.

Because of the need to avoid asymmetrical loading on the IC package, heat sink installation according to this prior art approach is difficult to implement. To ascertain that all four springs are collectively pressing in continual balance with each other necessitates extreme care. Moreover, shall the need arises to remove the heat sink from the IC package, this intricate spring system makes removal of heat sink a difficult task as well.

Finally, another disadvantage associated with this prior art approach is that a different IC package/heat sink combination necessitates extensive adjustments. In other words, this prior art approach is not well suited to accommodate different requirements of different heat sink/IC package combinations.

All in all, a need exists for improving and simplifying installation and removal of a heat sink to and from an IC package. Thus, a need exists for a system and method to couple a heat sink onto an IC package without being difficult to install the heat sink. A need also exists for a system and method to couple a heat sink onto an IC package without being difficult to remove the heat sink shall the need to do so arises. A further need exists for a system and method to couple a heat sink onto an IC package without reducing the heat transfer efficiency of the heat sink. Still another need exists for a system and method to couple a heat sink onto an IC package while remaining adaptable to the different force requirements of various IC package/heat sink combinations. Moreover, a need exists for system and method to couple a heat sink while not introducing unbalanced loading on the IC package.

Fortunately, as will be explained in the coming sections, the present invention answers all of the needs discussed above. In addition, the present invention offers new advantages not found in these prior art approaches.

SUMMARY

The present invention is drawn to a system and method for securing a heat sink onto a IC package disposed on a PCB. The present invention differs from the prior art approaches by adapting a stepped procedure that clearly separates the installation process into two finer steps of a attaching step and a tightening step. Also, the present invention differs from one prior art approach by implementing just one single spring. The heat sink and its mechanical support constitute a heat sink assembly that is first attached in a first configuration onto the IC package. Then, this heat sink assembly is modified into a modified configuration adapted to tighten the heat sink onto the IC package without risking damages to the IC package.

The first configuration of the heat sink assembly simplifies the process of attaching the heat sink onto the IC package; the modified configuration of the heat sink assembly enables a load-balanced and efficient thermal contact to be achieved between the heat sink support portion of the mechanism and the IC package. With the delicate contact being formed safely between the heat sink and the IC package, the present invention overcomes all of the disadvantages associated with the prior art approaches. In addition, the present invention introduces additional advantages not available before.

At least three advantageous innovations are implemented by the present invention. The first innovation is the implementation of one single spring. The second innovation is the refinement of heat sink installation by clearly separating attaching heat sink from tightening into a multi-step process. The third innovation is the placement of a spring within a module manufactured independently from the rest of the heat sink assembly.

Specifically, by using just a single spring instead of multiple springs to tighten the heat sink onto the IC package, asymmetrical loading caused by multiple springs is avoided. By removing the need to prevent asymmetrical loading, the present invention simplifies installation of a heat sink onto an IC package. Also, by removing the need to prevent asymmetrical loading, the present invention simplifies removal of a heat sink to an IC package shall such need arises.

Several additional advantages not found in the prior art approaches are also offered by the present invention. Specifically, the present invention need not perform one single installation step that includes attaching the heat sink onto the IC package and tightening the heat sink onto the IC package. Rather, one embodiment of the present makes a clear separation between an attaching step and a tightening step. In so doing, clear separation of the attaching step from the tightening step allows the present invention to simplify the installation and removal process while avoiding damages to the IC package. Also, clear separation of the attaching step from the tightening step allows the present invention to fine tune the force being exerted on the IC package during the tightening step without being concerned with how the attaching step is carried out. In so doing, the present invention is well suited for adapting to different force requirements of various IC package/heat sink combinations without having to alter the structure of the heat attaching mechanism.

A spring module constitutes one major component of a heat sink assembly. Yet by being a module within the heat sink assembly, the spring module has its own independent features. For example, the spring module itself can be easily exchanged for another spring module having a different spring. Or, the spring within the spring module can be easily exchanged for another spring. Thus, the spring module facilitates adaptability of the heat sink assembly in view of various possible IC package/heat sink combinations.

In one embodiment of the present invention, a heat sink attaching system is implemented for securing a heat sink onto an IC package disposed on a PCB. This system is comprised of a spring module, a heat sink assembly, and a terminating plate. The spring module is operable as a compressed spring module and as a released spring module. While coupling the major components, the heat sink assembly and the terminating plate are coupled to the spring module as the compressed spring module rather than as the released spring module.

Specifically, the heat sink assembly is comprised of a spreader block and a plurality of alignment posts protruding from the spreader block. The spreader block constitutes the heat sink because it is adapted to dissipate heat away from the IC package upon contact with the IC package. The plurality of alignment posts couple the spreader block from IC package side of the PCB to the spring module from non-IC package side of the PCB. As such, the IC package placed on the PCB is sandwiched directly between the spreader block and the compressed spring module.

After the spreader block has already been coupled to the compressed spring module, the terminating plate from non-IC package side is coupled to tips of the plurality of alignment posts. With the terminating plate coupled in place, the spreader block of the heat sink assembly is prevented from decoupling from the spring module. Furthermore, after the terminating plate has been coupled in place to prevent the heat sink assembly from decoupling from the spring module, the compressed spring module is reconfigured into the released spring module. With the terminating plate in place, the released spring module cannot decouple from the heat sink assembly. In particular, the released spring module pulls the spreader block towards the IC package and pushes the IC package towards the spreader block, thereby securing the spreader block onto the IC package.

More specifically, in the present embodiment, the spring module includes a spring that is compressed within a first spacing formed by a bearing plate and a retention screw. Once coupled to both the spreader block and the terminating plate, the compressed spring module is modified into a the released spring module by removing the retention screw from the compressed spring module. In the released spring module, the spring is now compressed within a second spacing formed by the bearing plate and the terminating plate. As such, the second spacing is longer than the first spacing to allow the spring to lengthen to a desired length. As the lengthening process unfolds, the spring pulls the spreader block towards the IC package and pushes the IC package towards the spreader block. In so doing, a load-balanced and efficient thermal contact is formed securely between the spreader block and the IC package without risking damages to the delicate IC package.

Moreover, the spring pushes against a washer that in turn pushes against the terminating plate. Because a force perpendicular to the alignment posts can disengage the washer from the terminating plate, the terminating plate includes a recess groove to accept the washer when the lengthening process of the spring is completed. As such, the washer is prevented from coming loose by any such perpendicular force.

All in all, the present invention separates the process of attaching the heat sink to the IC package from the process of tightening the heat sink to the IC package. Also, because the spring is disposed within the spring module, the present invention separates the details of calibrating the spring from the rest of the heat sink attaching system. In so doing, during the final assembly of the PCB, the installation of the heat sink is as simple as removing a retention screw after placing the parts of the heat sink attaching system onto the PCB.

Finally, the advantages of this design in the present embodiment are that it is easy to install, easy to remove for reworking of the PCB or the chip. In addition, the present embodiment is adaptable to the different force requirements of various IC package/heat sink combinations.

These and other objects and advantages of the present invention will no doubt become obvious to those of ordinary skill in the art after having read the following detailed description of the preferred embodiments which are illustrated in the various drawing figures.

BRIEF DESCRIPTION

The accompanying drawings which are incorporated in and form a part of this specification, illustrate embodiments of the invention and together with the description, serve to explain the principles of the invention:

Figure 10:
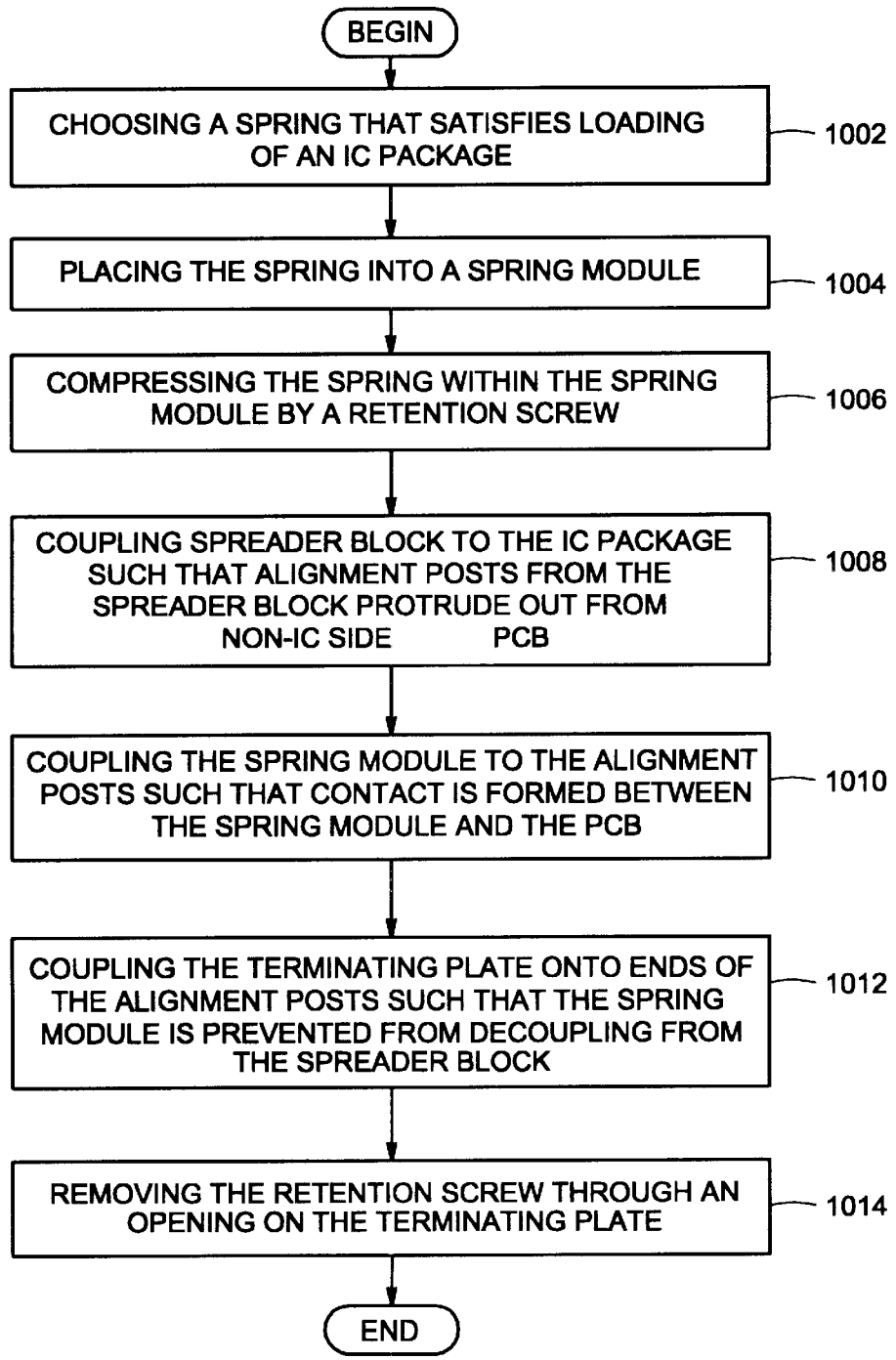

FIG. 10 presents a flow chart to outline the steps of a heat sink attaching method in accordance with one embodiment of the present invention.

DETAILED DESCRIPTION OF THE FIGURES

Reference will now be made in detail to the preferred embodiments of the invention, a system and method for installing a heat sink onto an integrated circuit (IC) package. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

The Present Invention

The present invention is drawn to a system and method for attaching a heat sink onto an IC package. The present invention differs from the prior art approaches in several ways. In particular, one embodiment of the present invention differs from one prior art approach by implementing just one single spring. Another embodiment of the present invention also differs from the prior art approaches by adapting a multi-step procedure that clearly separates the installation process into two finer steps of a attaching step and a tightening step. In detail, the heat sink and its mechanical support constitute a heat sink assembly that is first attached in a first configuration onto the IC package. Then, this heat sink assembly is modified into a second configuration adapted to tighten the heat sink onto the IC package without risking damages to the IC package.

The first configuration of the heat sink assembly simplifies the process of attaching the heat sink onto the IC package; the second configuration of the heat sink assembly enables a load-balanced and efficient thermal contact to be achieved between the heat sink mechanical support portion of the heat sink assembly and the IC package. With the delicate contact being formed safely and securely between the heat sink and the IC package, the present invention overcomes all of the disadvantages associated with the prior art approaches. In addition, the present invention introduces several advantages not available before.

Synopsis of the Detailed Description

In the following detailed description of the present invention, several embodiments and a flow chart are presented. Because of the numerous elements of the present invention. These embodiments are presented in various stages of assembly and in various degree of details. Specifically, in describing one embodiment in an organized fashion, elements of this embodiment are grouped into major components: a heat sink assembly, a IC package assembly, and a spring module. However, the abstract division of the present embodiment into three major components is meant only to facilitate an orderly description. Thus, this abstract division of elements in the present embodiment should not be taken as the only possible way of grouping the elements in the present embodiment.

In organizing the description, these major components are first described in isolation, then in relation to each other, and finally holistically. That is, specifically, structure and functions of these three major components are first described in isolation from each other. Then, structure and functions of these three major components are described in relation with each other. Finally, structure and functions of these three major components are described as a whole.

Heat Sink Assembly and Its Structure and Configurations

Figure 1A:
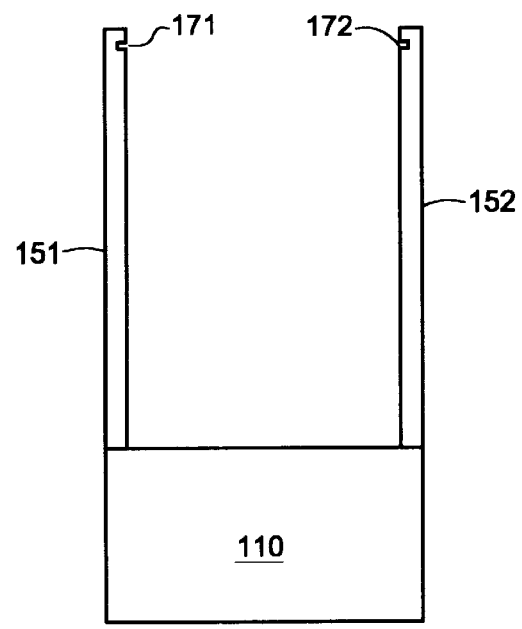
FIG. 1A depicts a heat sink assembly in its open configuration according to one embodiment of the present invention.
Figure 1B:
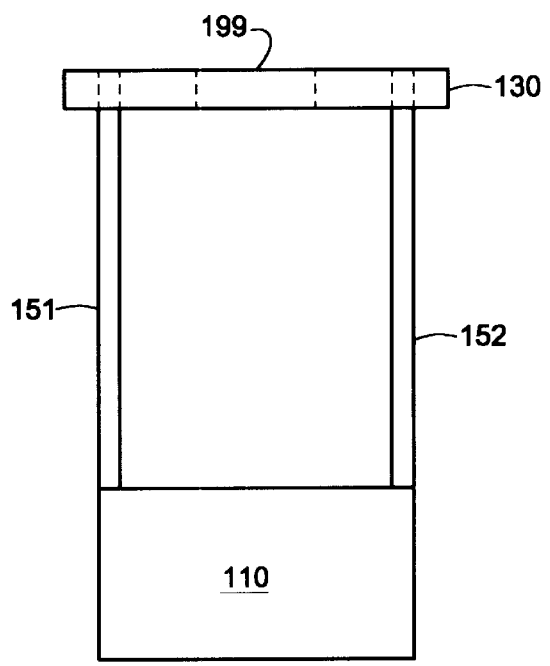
FIG. 1B depicts a heat sink assembly in its closed configuration according to one embodiment of the present invention.

In the present embodiment, a heat sink assembly 100 is depicted in isolation in both FIGS. 1A–B. In particular, FIG. 1A depicts an open configuration of heat sink assembly 100 while FIG. 1B depicts a closed configuration of heat sink assembly 100.

Referring now to both FIGS. 1A–B, a heat sink assembly 100 is comprised of a spreader block 110 having four alignment posts 151–154 (153–154 not shown) and a terminating plate 130. Spreader block 110 is shaped as a rectangular block as shown. Also, spreader block 110 constitutes the heat sink in the present embodiment; thus, spreader block 110 is typically made of copper, or any other efficient thermal conducting material. Alignment posts 151–154 protrude from spreader block 110. More specifically, as shown, one alignment post protrudes from each corner of spreader block 110. These alignment posts 151–154 are also similarly machined with keyway slots 171–174 (173–174 not shown) disposed toward the end of alignment post 151–154.

Continuing with both FIGS. A and B, terminating plate 130 includes four keyways 181–184 (183–184 not shown). Furthermore, terminating plate 130 includes an oval opening 199 disposed in the center of terminating plate 130. The function of oval opening 199 will be explained in a later section that describes the whole embodiment.

Referring now to FIG. 1A, the open configuration of heat sink assembly 100 is depicted. In this open configuration, terminating plate 130 is yet to be coupled to alignment posts 151–154 protruding from spreader block 110.

On the other hand, referring now to FIG. 1B, the closed configuration of heat sink assembly 100 is depicted. In this closed configuration, terminating plate 130 has been coupled to alignment posts 151–154 protruding from spreader block 110. In particular, the coupling of the terminating plate 130 with alignment posts 151–154 is implemented by locking each keyway slot from each alignment post into the keyway slot's matching keyway. For example, as shown, keyway slot 171 of alignment post 151 is locked into its matching keyway 181 on terminating plate 130.

Figure 2A:
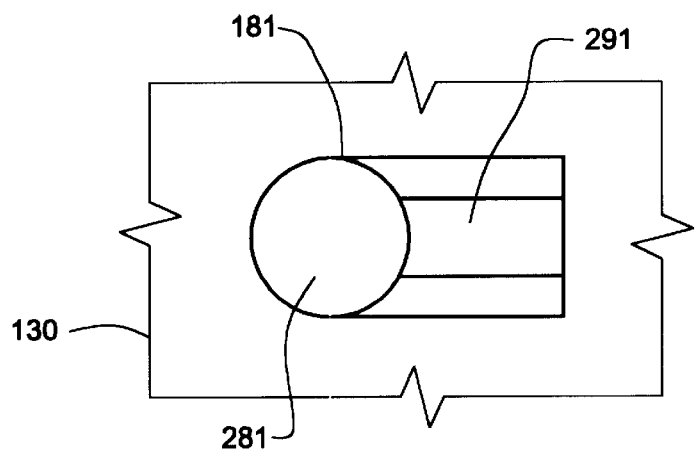
FIGS. 2A depicts top view of a keyway slot and its matching keyway prior to being coupled together in accordance to one embodiment of the present invention.
Figure 2B:
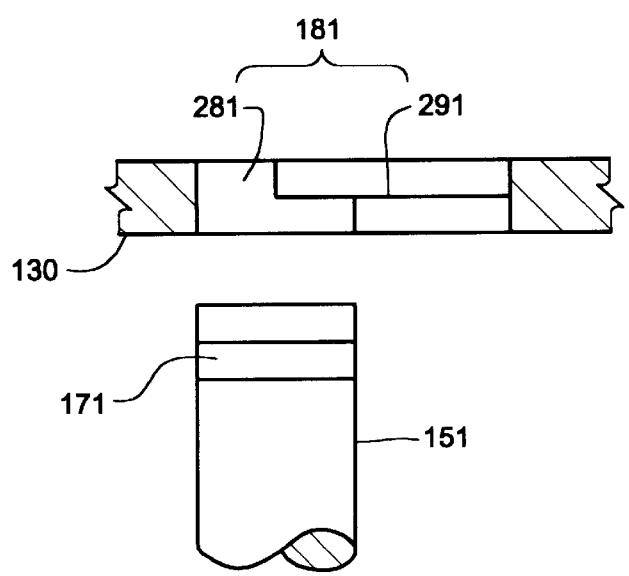
FIGS. 2B depicts side view of a keyway slot and its matching keyway prior to being coupled together in accordance to one embodiment of the present invention.

Referring now to FIGS. 2A–B, 3A–B and 4A–B, one implementation of coupling keyways 181–184 and their matching keyway slots 171–174 is depicted from various stage of assembly. As an example, FIGS. 2A–B show keyway 181 and keyway slot 171 prior to being coupled together.

Specifically, in FIG. 2A, the top view of keyway 181 is depicted. Keyway 181 includes a circular hole 281 and a sliding track 291.

In FIG. 2B, side view of both keyway 181 and end portion of alignment post 151 are depicted. As shown, a keyway slot 171 is disposed at a distance from the tip of alignment post 151 wherein this distance is equal to the depth of sliding track 291.

Figure 3A:
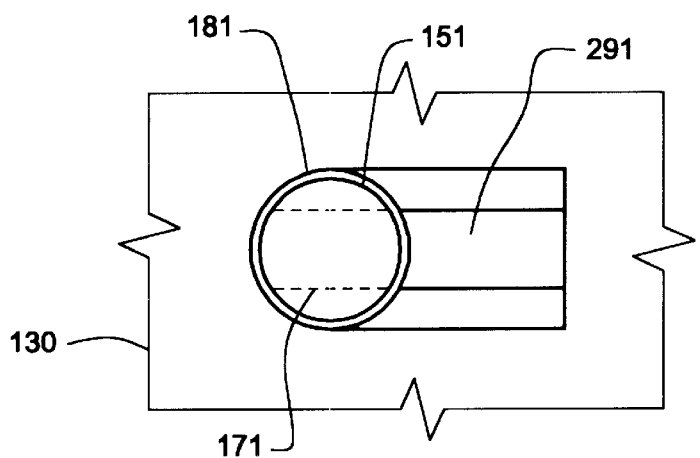
FIG. 3A depicts top view of a keyway slot and its matching keyway while being partially coupled together in accordance to one embodiment of the present invention.
Figure 3B:
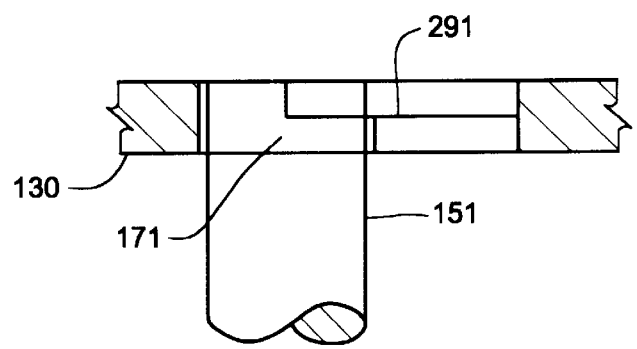
FIG. 3B depicts side view of a keyway slot and its matching keyway while being partially coupled together in accordance to one embodiment of the present invention.

FIGS. 3A–B show keyway 181 and keyway slot 171 in the process of being coupled together. FIG. 3A depicts the top view of alignment post 151 inserted into circular hole 281 of keyway 181. FIG. 3B depicts the side view of alignment post 151 inserted into circular hole 281 of keyway 181.

Figure 4A:
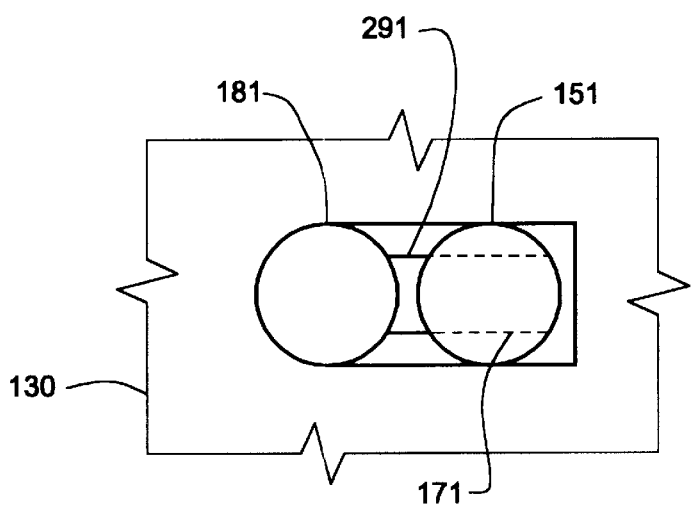
FIG. 4A depicts top view of a keyway slot and its matching keyway after having been completely coupled in accordance to one embodiment of the present invention.
Figure 4B:
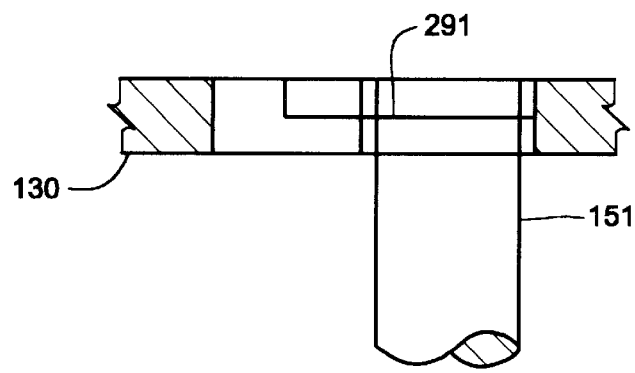
FIG. 4B depicts side view of a keyway slot and its matching keyway after having been completely coupled in accordance to one embodiment of the present invention.

FIGS. 4A–B show the completed coupling between keyway 181 and keyway slot 171. FIG. 4A shows the top view of the tip of alignment post 151 that has slided to the end of sliding track 291 of keyway 181. FIG. 4B shows the side view of alignment post 151 having been slided to the end of sliding track 291. The motion of terminating plate 130 perpendicular to sliding track 291 is prevented by the completed coupling between keyway 181 and keyway slot 171.

With the implemented designs for keyways 181–184 and keyway slots 171–174, coupling each keyway to its matching keyway slot becomes a straightforward task of inserting each alignment post into its matching keyway, and sliding terminating plate 130 over a short distance to complete the coupling. In addition, the decoupling process becomes a straightforward task of sliding terminating plate 130 towards circular holes 281–284 and free each alignment post from its matching keyway.

IC assembly; Its Structure

Figure 5:
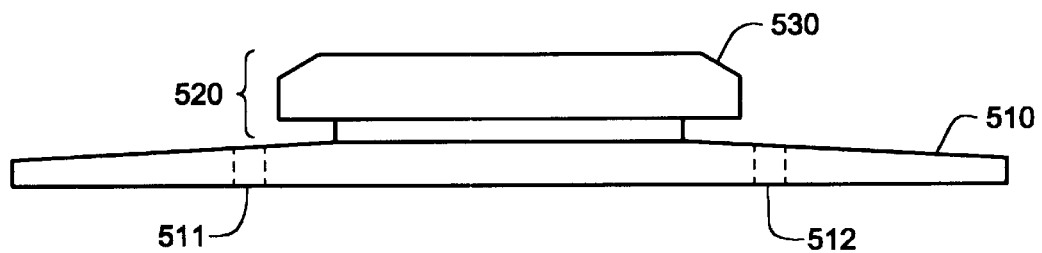
FIG. 5 depicts an integrated circuit (IC) assembly according to one embodiment of the present invention.

Referring now to FIG. 5, an IC assembly 500, the second major component in the present embodiment, is depicted in accordance to the present embodiment. In particular, IC assembly 500 is comprised of a printed circuit board (PCB) 510 and an IC package 520. IC package 520 has typically a ceramic case 530 surrounding and protecting a die (not shown) contained within. Furthermore, pins from IC package emanating out of ceramic case 530 and connects to other wires on PCB 510.

Referring still to FIG. 5, for ease of reference, the two sides of PCB 510 are designated as IC package side 550 and non-IC package side 570. Moreover, four holes 511–514 as shown are disposed on PCB 510 near the four corners of IC package 520. Each of holes 511–514 (513–514 not shown) is matched to one of four alignment posts 151–154 (depicted in FIG. 1A). In particular, as will be described in detail later, alignment posts 151–154 will be inserted from IC package side 550 of PCB 510 into holes 511–514, then emerge out of non-IC package side 570 of PCB 510. Further details will be given in the section that describes the inter-connection between all major components of the present embodiment.

Spring Compression Module; Its Structure and Configurations

Much of the structural and functional complexity of the present embodiment can be thought of as residing within the final major component of the present embodiment, namely the spring module. By not being just a part of the present embodiment, but rather a module within the present embodiment, much of the present embodiment's complexity can be absorbed into the spring module and dealt with separately from the other major components of the present embodiment. Hence, advantageously, the independent character of the spring module simplifies the entire installation process.

Figure 6A:
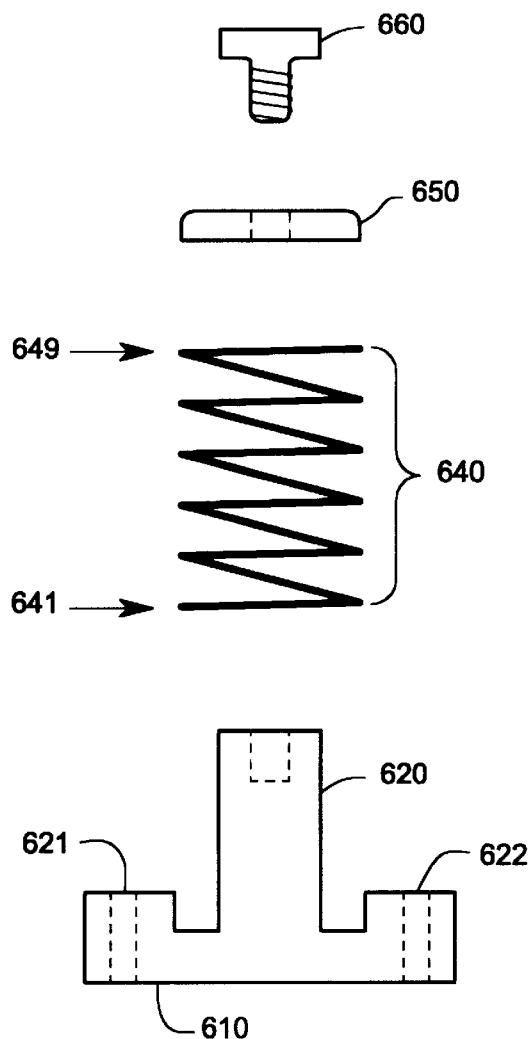
FIG. 6A depicts unassembled elements of a spring module in one embodiment of the present invention.

Referring now to FIGS. 6A–D, parts of a spring module 600 are shown in various stages of assembly. In FIG. 6A, elements of spring module 600 are shown before being assembled. Spring module 600 includes a rectangularly shaped bearing plate 610 having in its center a protruding post 620. Bearing plate 610 includes holes 621–624 (holes 623–624 not shown) that are matched to alignment posts 151–154 of spreader block 110. Protruding post 620 is surrounded at its base by a spring collecting groove 630. A spring 640 is shown poised to be coupled to bearing plate 610. Spring 640 has two ends that are designated a fixed end 641 and a free end 649. Furthermore, a washer 650 and a retention screw 660 are also shown.

Figure 6B:
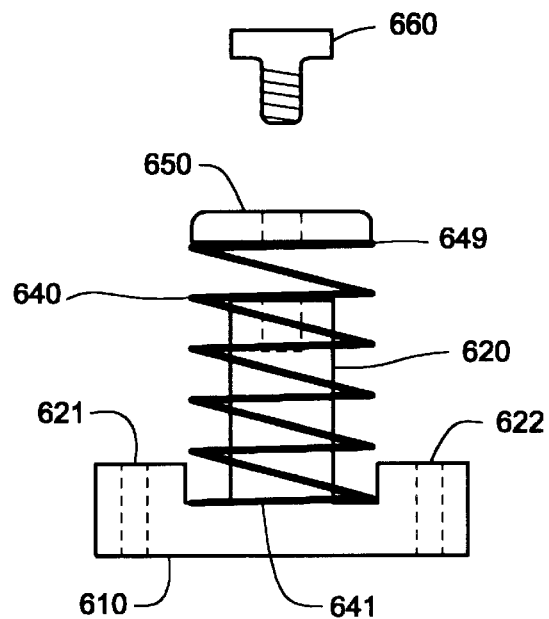
FIG. 6B depicts a partially assembled spring module in one embodiment of the present invention.

Referring now to FIG. 6B, spring 640 is assembled to bearing plate 610. As shown in FIG. 6B, spring 640 is not compressed. Also, spring 640 is penetrated length-wise by protruding post 620. In particular, fixed end 641 of spring 640 is collected within spring collecting groove 630 that prevents spring 640 from moving laterally. On the other hand, free end 649 of spring 640 can move along the longitudinal direction of protruding post 620. In particular, free end 649 can be pulled to lengthen spring 640 with respect to protruding post 620; free end 649 can also be pushed to shorten spring 640 with respect to protruding post 620. When spring 640 is not compressed, free end 649 of spring 640 as shown extends beyond protruding post 620.

Figure 6C:
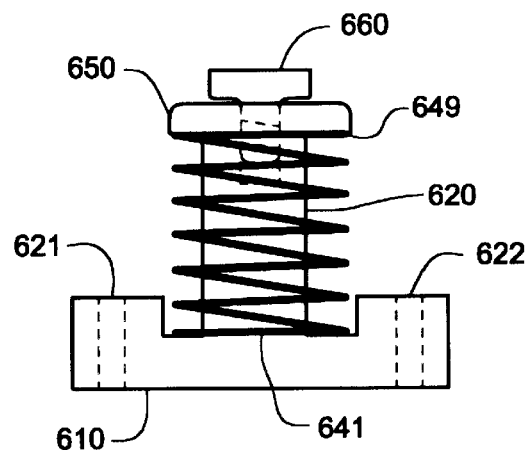
FIG. 6C depicts a compressed spring module according to one embodiment of the present invention.
Figure 6D:
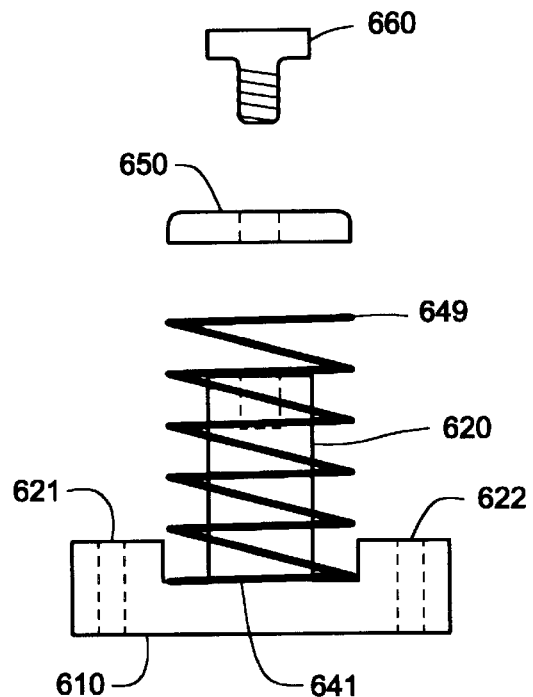
FIG. 6D depicts a released spring module according to one embodiment of the present invention.

FIGS. 6C–D depict respectively compressed spring module 677 and a released spring module 688 reconfigured from the compressed spring module 677. Specifically, how free end 649 of spring 640 is confined and compressed along the longitudinal direction of protruding post 620 distinguishes between compressed spring module 677 and released spring module 688.

Referring now to FIG. 6C, compressed spring module 677 is depicted. As depicted, spring 640 is compressed on fixed end 641 by bearing plate 610 and on free end 649 by a washer 650. Washer 650 is secured in place by retention screw 660. In particular, retention screw 660 is coupled to protruding post 620 by screwing into a threaded opening (not shown) on the free end 649 of protruding post 620.

Referring now to FIG. 6D, released spring module 688 is depicted. Released spring module 688 is reconfigured from compressed spring module 677. Specifically, retention screw 660 is unscrewed from protruding post 620 and removed from compressed spring module 677. In so doing, compressed spring module becomes released spring module 688 as shown such that free end 649 extends pass protruding post 620. Also as shown, fixed end 641 of spring 640 is still collected by spring collecting groove 630, while free end 649 of spring 640 is still in contact with washer 650.

Coupling Relations Among the Three Major Components

Having described the three major components individually, description is now given specifically for how they are coupled to each other in the present embodiment. FIGS. 7A–D depict these three major components in various stages of assembly.

Figure 7A:
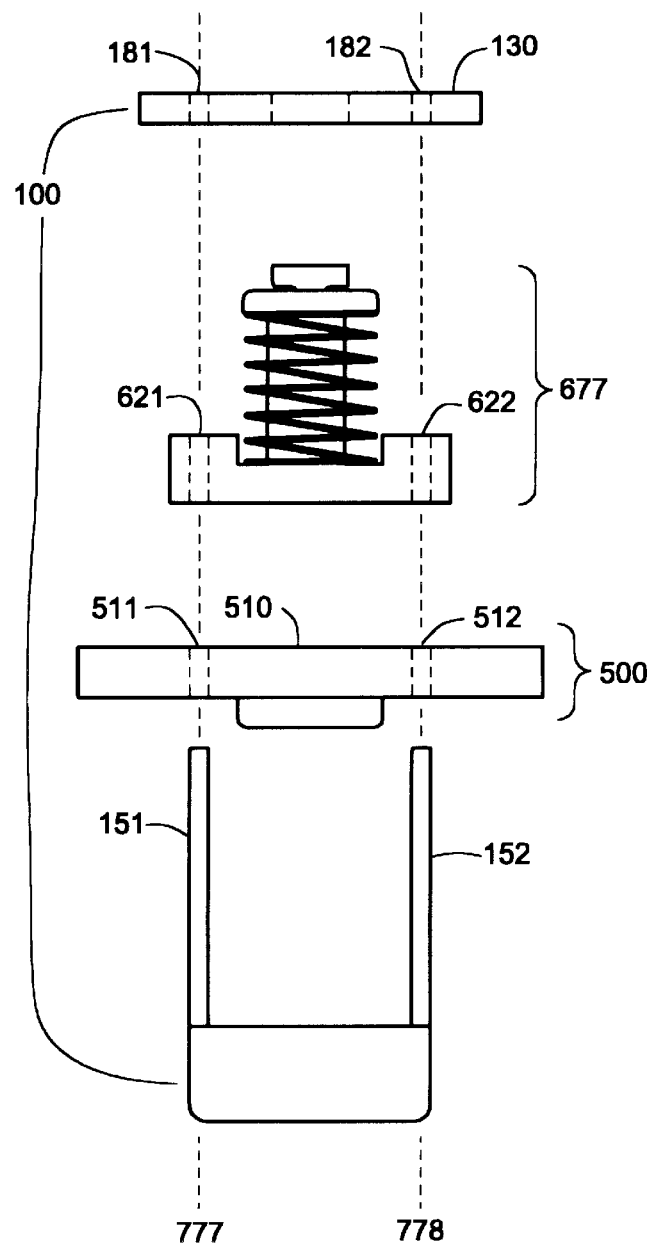
FIG. 7A depicts a heat sink assembly, an IC assembly and a compressed spring module prior to being coupled together to form a heat sink attaching system in accordance with one embodiment of the present invention.

Referring now to FIG. 7A, all three major components (heat sink assembly 100, IC assembly 500, and spring module 600) are shown prior to being coupled together. As shown, heat sink assembly 100 is in open configuration wherein terminating plate 130 and alignment posts 151–154 are not yet coupled together. Also, compressed spring module 677 rather than released spring module 688 is used for assembling these three major components. Lines 777–778 are depicted to indicate the alignment of these three major components. In particular, alignment posts 151–154 are aligned with holes 511–514 of PCB, holes 621–624 of bearing plate 610 and keyways 181–184 of terminating plate 130.

Figure 7B:
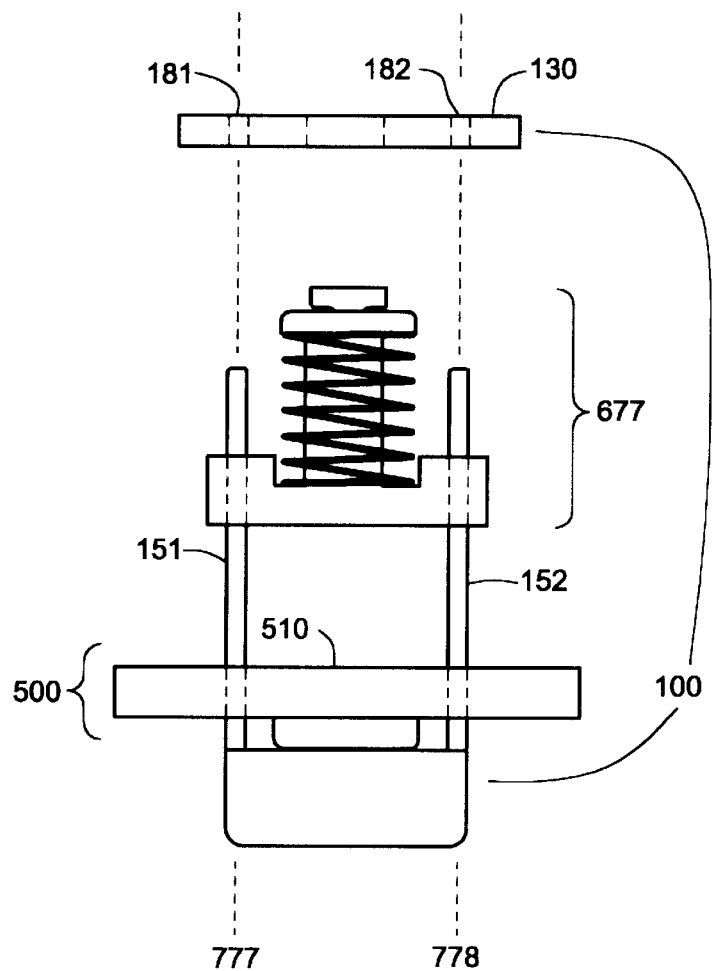
FIG. 7B depicts a heat sink assembly having been coupled to an IC assembly to form a partial heat sink attaching system in accordance with one embodiment of the present invention.

Referring now to FIG. 7B, alignment posts 151–154 are inserted through PCB 510 from IC side of PCB 510 such that spreader block 110 comes in contact with top surface of IC package 520.

Figure 7C:
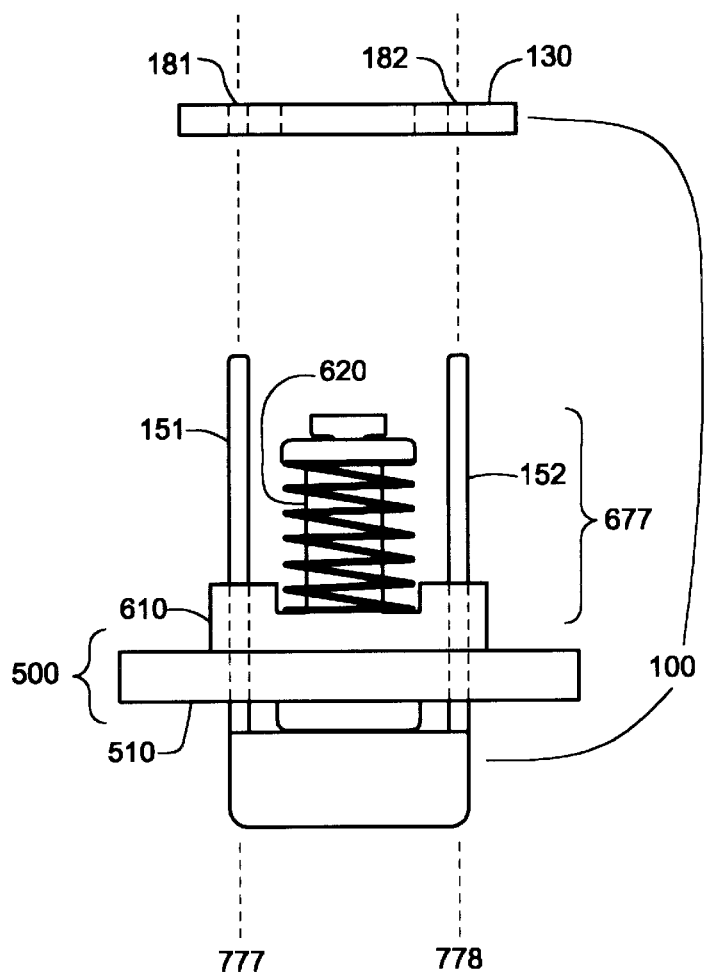
FIG. 7C depicts a compressed spring module having been coupled to the partial heat sink attaching system depicted in FIG. 7B to form a second partial heat sink attaching system.

Then, referring now to FIG. 7C, alignment posts 151–154 are then inserted through bearing plate 610 of compressed spring module 677 with protruding post 620 pointing away from PCB 510 while bearing plate 610 comes in contact with PCB 510.

Figure 7D:
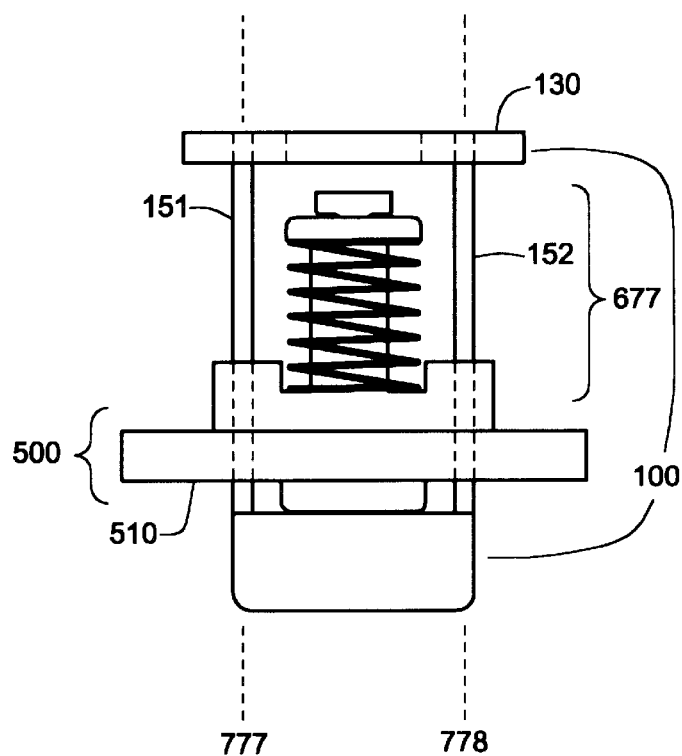
FIG. 7D depicts a completed heat sink attaching system in accordance with one embodiment of the present invention.

Finally, referring now to FIG. 7D, terminating plate 130 is coupled to alignment posts 151–154 with locking process described before with respect to FIGS. 2A–B, 3A–B, and 4A–B. In particular, with keyways 181–184 of terminating plate 130 locked into keyway slots 171–174 of alignment posts 151–154, terminating plate 130 prevents alignment posts 151–154 from slipping back out of PCB 510. Further, compressed spring module 677 is prevented from sliding out of alignment posts 151–154.

The Present Embodiment; Its Functions and Configurations

Major components of the present embodiment have been described individually and in relation with each other. In the present embodiment, how these components function holistically as the heat sink attaching system will now be described. In particular, the following sections describe a) possible configurations of the heat sink attaching system, b) problems solved by the heat sink attaching system, and c) various additional advantages provided by the heat sink attaching system.

Figure 8A:
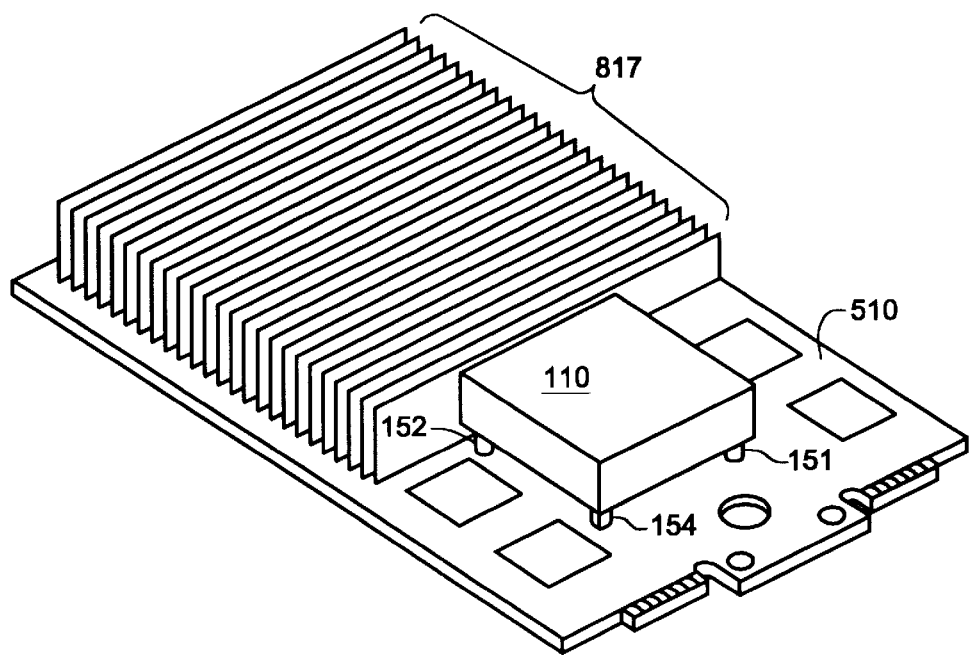
FIG. 8A depicts a heat sink attaching system from a three dimensional vantage point located on IC package side of the printed circuit board (PCB).

Referring now to FIG. 8A, a complete heat sink attaching system 800 is depicted from a three dimensional vantage point located on IC package side of PCB 510. From this vantage point, alignment posts 151–154 are seen to penetrate into PCB 510. From the same vantage point, IC package 520 is hidden from view by spreader block 110. Also, compressed spring module 677 is also hidden from view by PCB 510. Moreover, a set 817 of ventilating leaves are coupled to spreader block 110 as shown. Set 187 of ventilating leaves further dissipate heat away from IC package 520.

Figure 8B:
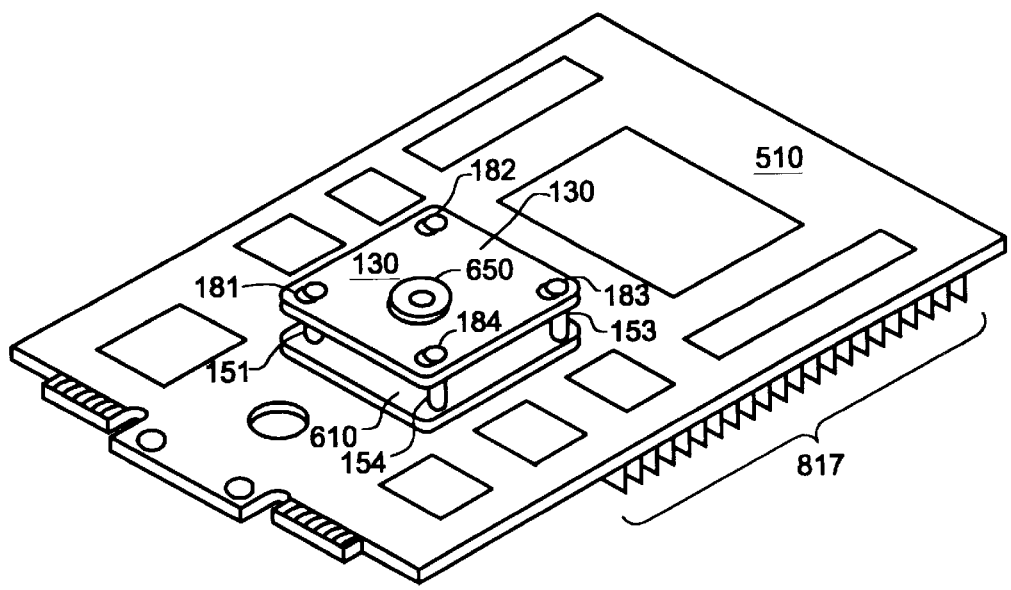
FIG. 8B depicts a heat sink attaching system from a three dimensional vantage point located on non-IC package side of the PCB.

Referring now to FIG. 8B, the completed heat sink attaching system 800 is depicted from another three dimensional vantage point located on non-IC package side of PCB 510. From this vantage point of view, alignment posts 151–154 are seen to emerge out from PCB 510 and bearing plate 610, then couple to terminating plate 130. As shown, terminating plate 130 has four keyways 181–184, each of which is matched and locked with a keyway slot from a alignment post. Keyway slots 171–174 are hidden from view; only the tips of alignment posts 151–154 are visible. Furthermore, in the present embodiment as seen from this vantage point of view, oval opening 199 of terminating plate 130 is visible. Through oval opening 199, part of retention screw 660 can also be seen from this vantage point. Although not completely shown, compressed spring module 677 is implemented within heat sink attaching system shown in FIG. 8B. Moreover, set 817 of ventilating leaves show partially.

Both FIGS. 8A–B depict heat sink attaching system 800 in its first configuration. This first configuration involves compressed spring module 677. However, a second configuration of heat sink attaching system 800 also exists. In particular, instead of compressed spring module 677, released spring module 688 is used in this second configuration. Thus, in order to further describe the structures and functions of these two configurations of heat sink attaching system 800, these two configurations are depicted respectively by FIGS. 9A and 9B.

Figure 9A:
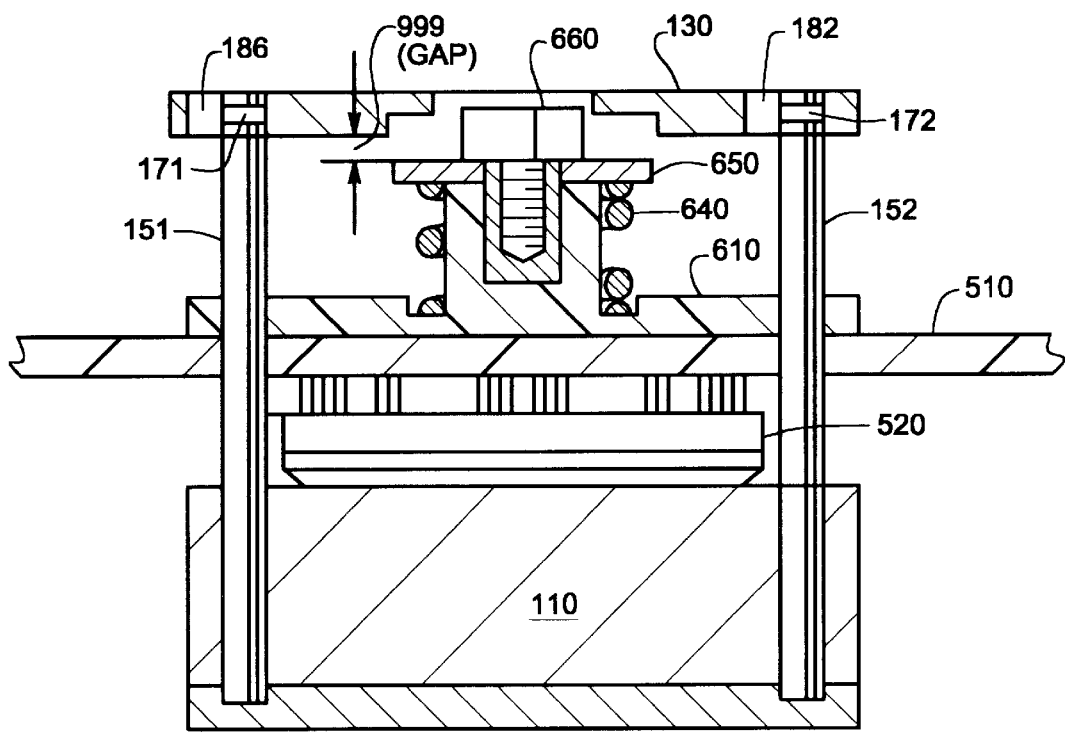
FIG. 9A depicts a cross section of a heat sink attaching system having a compressed spring module in accordance with one embodiment of the present invention.

Referring now to FIG. 9A, first configuration of heat sink attaching system 800 is depicted by a cross sectional view. In particular, FIG. 9A depicts heat sink attaching system 800 after preliminary couplings among different components have been completed. Compressed spring module 677 is involved in this first configuration. As such, spring 640 exerts force on bearing plate 610 and washer 650, wherein washer 650 is kept in place by retention screw 660 that is screwed into protruding post 620. Moreover, a noticeable gap 999 is present between terminating plate 130 and washer 650. Thus, spring 640 does not exert force on terminating plate 130 nor IC assembly 500.

Figure 9B:
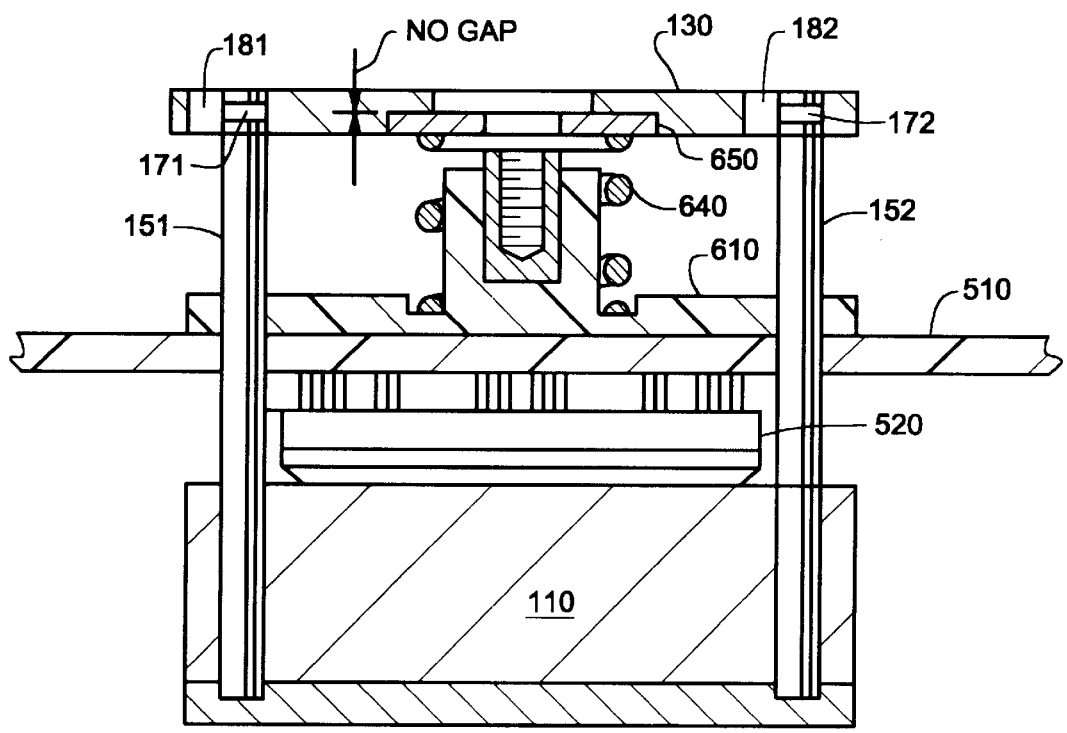
FIG. 9B depicts a cross section of a heat sink attaching system having a released spring module in accordance with one embodiment of the present invention.

Referring now to FIG. 9B, second configuration of heat sink attaching system 800 is depicted by a cross sectional view. Retention screw 660 is absent because retention screw 660 has been removed from heat sink attaching system 800 through oval opening 199 disposed about the center of terminating plate 130. In particular, oval opening 199 is still small enough such that, upon the removal of retention screw 660, washer 650 is prevented from going through oval opening 199. Furthermore, as retention screw 660 is being removed, spring 640 pushes washer 650 as far as allowed. Until upon the complete removal of retention screw 660, spring 640 pushes and secures washer 650 against terminating plate 130. Moreover, in this second configuration of heat sink attaching system 800, NO gap is present between terminating plate 130 and washer 650.

Referring still to FIG. 9B, a description is now given for what is happening unobserved. Although in the second configuration no motion is observed, free end 649 of spring 640 is continuously exerting force on washer 650 that in turn pushes on terminating plate 130. Simultaneously, fixed end 641 of spring 640 is continuously exerting force on bearing plate 610 that in turn pushes on PCB 510.

Continuing with FIG. 9B, specifically, as terminating plate 130 is pushed in the direction away from bearing plate 610, spreader block 110 that is coupled to terminating plate 130 via alignment posts 151–154 is pulled toward IC package 520. In other words, a pulling force is being exerted on spreader block 110 directed toward IC package 520. Moreover, spring 640 pushes against washer 650 that in turn pushes against terminating plate 130. Because a force perpendicular to alignment posts 151–154 can disengage washer 650 from terminating plate 130, terminating plate 130 includes a recess groove as shown to accept washer 650 when the lengthening process of spring 640 is completed. As such, washer 650 is prevented from coming loose by any such perpendicular force.

At the same time, referring still to FIG. 9B, as PCB 510 and IC package 520 is pushed in the direction away from terminating plate 130, IC package 520 is pushed toward spreader block 110. In other words, a pushing force is being exerted on IC package 520 directed toward spreader block 110. Because of these two forces, a firm contact is formed between spreader block 110 and IC package 520.

Advantages of the Present Embodiment

Referring still to FIG. 9B, several advantages become immediately apparent. By using a single spring such as spring 640 to tighten spreader block 110 to IC package 520, no more delicate procedure is required for load-balancing multiple springs is required. In addition, by disposing the spring within a spring module, manufacturing process can be streamlined. In particular, messy spring loading can be avoided during the on-site installation of the heat sink attaching system. Once the specific loading requirement of IC package 520 is known, supplying compressed spring module 677 can be delegated off-site to vendors who specialize in providing a spring that satisfies the loading requirement. Spring 640 itself can be easily chosen and calibrated off-site, thereby reducing the time and complexity of on-site installation of heat sink attaching system 800. As such, a precise load and a balanced load is being exerted on IC package 520, thus avoiding damage in IC package 520. Consequently, referring back to FIG. 9A, the tightening process is reduced to a simple step of removing retention screw 660 from compressed spring module 677.

Flow Chart of One Embodiment of the Present Invention

The present invention is also drawn to a method of attaching a heat sink onto an IC package with a precise and balanced load. According to this method, the entire attaching process is streamlined by having it separated into a coupling step and a tightening step. In particular, this separation of steps streamlines the entire heat sink attaching process because details of coupling a heat sink to an IC package can be handled independently from the tightening step. That is, the heat sink can be coupled to the IC package without having to perform the tightening step immediately. Similarly, details of tightening a spreader block onto an IC package with precise and load-balanced force can be handled independently from the coupling step. The tightening step does not need to be implemented immediately after the coupling step. Moreover, the tightening step is implemented by simply remove a screw from the heat sink attaching system. Further yet, as will be explained below, the method is well suited for adapting to various requirements of various heat sink/IC package combinations.

Referring now to FIG. 10, a flow chart 1000 is presented to outline the steps of one embodiment of the present invention. These steps are grouped into three phases. Steps 1002, 1004, and 1006 of first phase concern calibrating and loading the spring into a spring module. Although these steps can be implemented on-site (i.e., during attaching a heat sink onto an IC package), these steps are especially well suited to be implemented in an off-site sitting anytime before attaching the heat sink onto the IC package. Thus, because calibrating the spring and loading the spring into the spring module is not time critical, ample time is allowed for calibrating and loading the spring in keeping with strictest requirements.

Specifically, in step 1002 of the first phase, a spring is chosen in view of satisfying loading requirement of an IC package. Loading requirement of the IC package is typically provided by the manufacturer of the IC package. The spring is chosen to have the desired tension such that the spring will exert a precise amount of force to facilitate firm contact between a spreader block and the IC package, while not causing damage to the IC package.

In step 1004 of the second phase, the spring in its uncompressed configuration is placed into a spring module. The spring module includes a square shaped bearing plate that has a post protruding from the center of the bearing plate. This post is used to immoblize the spring by penetrating through the empty center of the spring with one end of the spring contacting the bearing plate. When the spring is penetrated by the post, the spring is prevented from moving laterally with respect to the bearing plate. Nevertheless, the spring still can move perpendicularly to the bearing plate along the axis of the post. This protruding post is slightly shorter than the length of the uncompressed spring. Thus, the free end of the spring is farther away from the bearing plate than the end of the post is from the bearing plate.

In step 1006 of the first phase, the spring is compressed so that it has the same length as that of the post. The free end of the spring is first covered with a washer. Then, a retention screw screws the washer onto the end of post. As such, because the washer covers the free end of the spring, the spring is compressed by the washer and the retention screw such that the free end is level with the end of the post. At the conclusion of step 1006 wherein a compressed spring module has been produced, the first phase of steps in the present embodiment is also completed.

Step 1008 begins the second phase of steps according to the present embodiment. Steps 1008, 1010 and 1012 of the second phase are implemented. At the conclusion of step 1012, the retention screw within the heat sink attaching system is poised to be removed.

Specifically, in step 1008 of the second phase, a spreader block (typically made of copper or any other efficient thermal conducting material) is coupled to the PCB such that spreader block forms contact with the exposed surface of the IC package. Typically, the contact surface of the spreader block is square shaped. In particular, four alignment posts protruding from the four corners of the spreader block's contact surface penetrate the PCB near outside of the four corners of the IC package. Moreover, tips of these alignment posts emerge from the non-IC package side of the PCB. At the conclusion of step 1008, the IC package is seen making contact with the spreader block. Also, alignment posts are seen protruding out of the non-IC package side of the PCB.

Next, in step 1010 of the second phase, the compressed spring module constructed before (in steps 1002, 1004 and 1006) is coupled to both the spreader block and the PCB. In particular, the protruding alignment posts are inserted into four holes located at the four corners of the bearing plate (of the compressed spring module). At the conclusion of step 1010, the bearing plate makes contact with the non-IC package side of the PCB while the four alignment posts are seen emerging from the four holes at the four corners of the bearing plate.

In step 1012 of the second phase, a square shaped terminating plate is coupled to the tips of the alignment posts. In particular, a keyway slot has been machined near the tip of each alignment post, while a keyway is located at the four corners of the terminating plate such each keyway slot is matched to a keyway. Then, the terminating plate is coupled to the alignment posts by having each keyway slot locked into its matching keyway. At the conclusion of this coupling in step 1012, both the spreader block and the compressed spring module is prevented from becoming decoupled from each other. Also at the conclusion of step 1012, a gap is seen between the terminating plate and the retention screw such that the spreader block's contact surface can be displaced a short distance from the top surface of the IC package. That is to say, the spreader block is not yet firmly in contact with the IC package.

In order to form firm contact between the spreader block and the IC package, a third final phase is entered to tighten the coupling between the spreader block and the IC package. Specifically, in step 1014 of the third phase, the retention screw is removed from the compressed spring module through an opening disposed at the center of the terminating plate. The compressed spring module is reconfigured into a released spring module.

In particular, during the removal of the retention screw in the third phase, the retention screw is displaced farther away from the protruding post of the bearing plate and closer to the terminating plate. In turn, the spring lengthens towards the terminating plate, pushing the washer that is covering the free end of the spring towards the terminating plate. Finally, upon the complete removal of the retention screw, the washer is pushed by the free end of the spring against the terminating plate.

Referring still to step 1014 of the third phase, in effect, the free end of the spring pushes the terminating plate away from the PCB while other end of the spring pushes the PCB away from the terminating plate. As such, when the terminating plate is pushed away from the PCB, the spreader plate coupled to the terminating plate is pulled towards the PCB. Also, when the PCB is pushed away from the terminating plate, the IC package is pushed towards the spreader block. Thus the spreader plate is pulled by the free end of the spring towards the IC package while the IC package is pushed by the other end of the spring towards the spreader block. Together, both of the pulling force and the pushing force create a firm and load-balanced contact between the spreader block and the IC package.

In summary, in step 1014 of the third phase, the retention screw is removed from the compressed spring module through an opening disposed about the center of the terminating plate. As a result, the spring is allowed room to lengthen until the spring is blocked on one end by the terminating plate and on the other end by the bearing plate. As explained before, in its lengthened position, the spring pulls spreader block toward IC package while simultaneously pushing IC package toward spreader block. Consequently, these two precisely loaded forces create a firm and load-balanced contact between spreader block and IC package.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. The scope of the invention is intended to be defined by the Claims appended hereto and their equivalents.

What is claimed is:

1. A heat sink attaching system for securing a heat sink onto an integrated circuit (IC) package disposed on a printed circuit board (PCB), said heat sink attaching system comprising:

a heat sink assembly coupled to said PCB;

a spring module coupled to said heat sink assembly such that said IC package resides between said spring module and said heat sink assembly, said spring module operable as a compressed spring module and a released spring module, wherein a spiral spring within said compressed spring module is compressed at a predetermined tension, and wherein said spring in said released spring module lengthens to pull said heat sink assembly towards said IC package and to push said IC package towards said heat sink assembly, thereby securing said heat sink onto said IC package.

2. The heat sink attaching system of claim 1, wherein said heat sink assembly comprises:

alignment posts protruding from said heat sink assembly, said alignment posts coupling said heat sink assembly to said compressed spring module such that said heat sink assembly from IC side of said PCB is coupled to said compressed spring module on non-IC side of said PCB; and a plate coupled to tips of said alignment posts after said heat sink assembly has already been coupled to said compressed spring module such that said heat sink assembly and said compressed spring module are prevented from decoupling from each other, wherein said compressed spring module is reconfigured into said released spring module so that said released spring module pulls said heat sink assembly towards said IC package and pushes said IC package towards said heat sink assembly, thereby securing said heat sink onto said IC package.

3. The heat sink attaching system of claim 2, wherein said heat sink assembly comprises:

a spreader block adapted to dissipate heat away from said IC package upon contact with said IC package, and said plurality of alignment posts protruding from said spreader block to couple said spreader block from IC package side of said PCB to said compressed spring module from non-IC package side of said PCB, wherein said IC package on said PCB resides between said heat sink assembly and said compressed spring module.

4. The heat sink attaching system of claim 3, wherein by reconfiguring said released spring module back to said compressed spring module while said plate is still coupled to said plurality of alignment posts, said compressed spring module ceases to pull said spreader block toward said IC package and ceases to push said IC package towards said spreader block, wherein said plate can be decoupled from said alignment posts such that said compressed spring module can be decoupled from said heat sink assembly to detach said heat sink assembly from said IC package without damaging said IC package.

5. The heat sink attaching system of claim 1, wherein said spring module as said compressed spring module comprises:
   a bearing plate having a protruding cylindrical shaft surrounded at its base by a circular spring collecting groove;
   said spring penetrated length-wise by said protruding shaft such that a first end of said spring is collected by said spring collecting groove to prevent said spring from moving radially with respect to said protruding cylindrical shaft;
   a washer covering a second end of said spring; and
   a retention screw screwed into the tip of said protruding cylindrical shaft such that said retention screw presses on said washer which in turn compresses said spring, wherein said compressed spring module is configurable into said released spring module upon the removal of said retention screw, and wherein said released spring module is reconfigurable back into said compressed spring module upon said retention screw rescrewed back into the tip of said protruding cylindrical shaft such that said retention screw presses on said washer which in turn compresses said spring.

6. The heat sink attaching system of claim 5, wherein said plate has a central opening through which said retention screw is removed from said compression spring module, said central opening small enough to prevent said washer from escaping through said central opening.

7. The heat sink attaching system of claim 2, wherein said alignment posts include keyway slots that couple to a plurality of keyways disposed on said plate such that said spring module is prevented from decoupling from said heat sink assembly.

8. The heat sink attaching system of claim 1, wherein heat sink assembly is adapted to couple to a plurality of ventilating leaves to further dissipate heat away from IC package.

9. The heat sink attaching system of claim 1, wherein said spring module is provided by off-site vendors such that on-site installation of said heat sink attaching system is streamlined, said spring of said spring module manufactured and calibrated to satisfy precise load requirement of said IC package.

10. The heat sink attaching system of claim 4, said spring of said spring module is replaceable by a different spring to accommodate a different requirement of heat sink/IC package combination.

11. A heat sink attaching system for securing a heat sink onto an IC package disposed on a PCB, said heat sink system comprising: a spiral spring module operable as a compressed spring module and a released spring module;
   a heat sink assembly comprising:
      a spreader block adapted to dissipate heat away from said IC package upon contact with said IC package, and
      a plurality of alignment posts protruding from said spreader block to couple said spreader block from IC package side of said PCB to said compressed spring module from non-IC package side of said PCB such that said IC package on said PCB resides between said heat sink assembly and said compressed spring module;
   a plate from non-PC package side coupled to tips of said plurality of alignment posts after said spreader block has already been coupled to said compressed spring module such that said spreader block and said compressed spring module are prevented from decoupling from each other, wherein said compressed spring module is reconfigured into said released spring module so that said released spring module pulls said spreader block towards said IC package and pushes said IC package towards said spreader block, thereby securing said heat sink onto said IC package.

12. The heat sink attaching system of claim 11, wherein said spring module as said compressed spring module comprises:
   a bearing plate having a protruding cylindrical shaft surrounded at its base by a circular spring collecting groove;
   a spring length-wise penetrated by said protruding shaft such that a first end of said spring is collected by said spring collecting groove to prevent said spring from moving radially with respect to said protruding cylindrical shaft;
   a washer covering a second end of said spring; and
   a retention screw screwed into the tip of said protruding cylindrical shaft such that said retention screw presses on said washer which in turn compresses said spring, wherein said compressed spring module is configurable into said released spring module upon the removal of said retention screw, and wherein said released spring module is reconfigurable back into said compressed spring module upon said retention screw rescrewed back into the tip of said protruding cylindrical shaft such that said retention screw presses on said washer which in turn compresses said spring.

13. The system of claim 12, wherein said plate has a central opening through which said retention screw is removed from said compression spring module, said central opening small enough to prevent said washer from escaping through said central opening.

14. The system of claim 12, wherein by reconfiguring said released spring module back to said compressed spring module while said plate is still coupled to said plurality of alignment posts, said compressed spring module ceases to pull said spreader block toward said IC package and ceases to push said IC package towards said spreader block, wherein said plate can be decoupled from said alignment posts such that said compressed spring module can be decoupled from said heat sink assembly to detach said heat sink assembly from said IC package without damaging said IC package.

15. The system of claim 11, wherein said alignment posts include keyway slots that couple to a plurality of keyways disposed on said plate such that said spring module is prevented from decoupling from said heat sink assembly.

16. The system of claim 11, wherein heat sink assembly is adapted to couple to a plurality of ventilating leaves to further dissipate heat away from IC package.

17. The system of claim 11, wherein said spring module is provided by off-site vendors such that on-site installation of said heat sink attaching system is streamlined, said spring of said spring module manufactured and calibrated to satisfy precise load requirement of said IC package.

18. The system of claim 12, said spring of said spring module is replaceable by a different spring to accommodate a different requirement of heat sink/IC package combination.

19. A method for coupling a heat sink onto an IC package disposed on a PCB, said method comprising the steps of:
   a1) attaching a spreader block of said heat sink onto said IC package by inserting alignment posts of said spreader block from IC side of PCB to pass through said PCB to non-IC side of PCB such that said spreader block makes contact with said IC package;
   a2) inserting alignment posts into a spring module from non-IC side of said PCB, wherein said spring module makes contact with non-IC side of said PCB, and wherein said IC package is aligned to reside between said spring module and said spreader block, said spring module having a spiral spring in a first compressed position;
   a3) locking a plate from non-IC side of said PCB onto ends of said alignment posts such that said spreader block and said spring module are prevented from decoupling from each other; and
   a4) tightening said spreader block onto said IC package by configuring said spring module to allow said spring to lengthen to a second compressed position within the confine of said plate, said spring pushing said plate away from said PCB such that said spring pulls said spreader block towards said IC package and pushes said IC package towards said spreader block, thereby forming a load-balanced and thermally efficient contact between said spreader block and said IC package.

20. The method of claim 19, wherein in step a2) said spring within said spring module is compressed by a washer that is fixed in place by a retention screw.

21. The method of claim 19, wherein by reversing said step a4) by compressing said spring back to its first compressed position while said plate is still coupled to said plurality of alignment posts, said spring ceases to pull said spreader block toward said IC package and ceases to push said IC package towards said spreader block, wherein said plate can be decoupled from said alignment posts such that said compressed spring module can be decoupled from said spreader block to detach said heat sink from said IC package without damaging said IC package.

22. The method of claim 19, wherein in said step a2) said spring module comprises:
   a bearing plate having a protruding cylindrical shaft surrounded at its base by a circular spring collecting groove;
   said spring length-wise penetrated by said protruding shaft such that a first end of said spring is collected by said spring collecting groove to prevent said spring from moving radially with respect to said protruding cylindrical shaft;
   a washer covering a second end of said spring; and
   a retention screw screwed into the tip of said protruding cylindrical shaft such that said retention screw presses on said washer which in turn compresses said spring, wherein said compressed spring module is configurable into said released spring module upon the removal of said retention screw, and wherein said released spring module is reconfigurable back into said compressed spring module upon said retention screw rescrewed back into the tip of said protruding cylindrical shaft such that said retention screw presses on said washer which in turn compresses said spring.

23. The method of claim 22, wherein said plate has a central opening through which said retention screw is removed from said compression spring module, said central opening small enough to prevent said washer from escaping through said central opening.

24. The method of claim 19, wherein said alignment posts include keyway slots that couple to a plurality of keyways disposed on said plate such that said spring module is prevented from decoupling from said heat sink assembly.

25. The method of claim 19, wherein said spreader block is adapted to couple to a plurality of ventilating leaves to further dissipate heat away from IC package.

26. The method of claim 19, wherein said spring module is provided by off-site vendors such that on-site installation of said heat sink attaching system is streamlined by not needing to calibrate spring compression, said spring of said spring module manufactured and calibrated to satisfy precise load requirement of said IC package.

27. The method of claim 19, said spring of said spring module is replaceable by a different spring for accommodating a different requirement of heat sink/IC package combination.

* * * * *